United States Patent
Toh et al.

(10) Patent No.: US 9,029,227 B2
(45) Date of Patent: May 12, 2015

(54) P-CHANNEL FLASH WITH ENHANCED BAND-TO-BAND TUNNELING HOT ELECTRON INJECTION

(75) Inventors: Eng Huat Toh, Singapore (SG); Elgin Quek, Singapore (SG); Ying Keung Leung, Singapore (SG); Sanford Chu, Leonie Condotel (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 783 days.

(21) Appl. No.: 13/038,081

(22) Filed: Mar. 1, 2011

(65) Prior Publication Data
US 2012/0223318 A1  Sep. 6, 2012

(51) Int. Cl.
| | |
|---|---|
| H01L 21/336 | (2006.01) |
| H01L 21/02 | (2006.01) |
| H01L 27/06 | (2006.01) |
| H01L 29/792 | (2006.01) |
| H01L 21/28 | (2006.01) |
| H01L 29/51 | (2006.01) |

(52) U.S. Cl.
CPC ........ H01L 29/792 (2013.01); H01L 21/28282 (2013.01); H01L 29/513 (2013.01)

(58) Field of Classification Search
USPC ......... 438/199, 183, 233, 259, 261, 275, 279, 438/591; 257/529, 209, E23.149
See application file for complete search history.

(56) References Cited

U.S. PATENT DOCUMENTS

| | | | |
|---|---|---|---|
| 6,335,251 B2 * | 1/2002 | Miyano et al. | 438/300 |
| 7,534,689 B2 * | 5/2009 | Pal et al. | 438/300 |
| 8,058,119 B2 * | 11/2011 | Chung et al. | 438/199 |
| 2003/0216038 A1 * | 11/2003 | Madhukar et al. | 438/648 |
| 2004/0132237 A1 * | 7/2004 | Kanemoto | 438/183 |
| 2006/0166492 A1 * | 7/2006 | Orlowski et al. | 438/637 |
| 2006/0228842 A1 * | 10/2006 | Zhang et al. | 438/184 |
| 2010/0078728 A1 * | 4/2010 | Li et al. | 257/369 |
| 2010/0315884 A1 * | 12/2010 | Toh et al. | 365/185.29 |
| 2012/0104498 A1 * | 5/2012 | Majumdar et al. | 257/351 |
| 2013/0105912 A1 * | 5/2013 | Hsu et al. | 257/379 |

OTHER PUBLICATIONS

Kane, E O., "Zener Tunneling in Semiconductors", J. Phys. Chem. Solids, Pergamon Press 1959, vol. 12, pp. 181-188.
Lin et al., "P-Channel Flash Memory Technology", (2008) Institute of Electrical and Electronics Engineers, Inc. 337-371.

(Continued)

*Primary Examiner* — Brett Feeney
*Assistant Examiner* — Tsz Chiu
(74) *Attorney, Agent, or Firm* — Ditthavong & Steiner, P.C.

(57) ABSTRACT

A p-channel flash memory is formed with a charge storage stack embedded in a hetero-junction layer in which a raised source/drain is formed. Embodiments include forming a dummy gate stack on a substrate, forming a layer on the substrate by selective epitaxial growth, on each side of the dummy gate stack, forming spacers on the layer, forming raised source/drains, removing the dummy gate stack, forming a cavity between the spacers, and forming a memory gate stack in the cavity. Different embodiments include forming the layer of a narrow bandgap material, a narrow bandgap layer under the spacers and a wide bandgap layer adjacent thereto, or a wide bandgap layer under the spacers, a narrow bandgap layer adjacent thereto, and a wide bandgap layer on the narrow bandgap layer.

13 Claims, 16 Drawing Sheets

(56) References Cited

OTHER PUBLICATIONS

Ohnakado et al., "Novel Electron Injection Method Using Band-to-Band Tunneling Induced Hot Electron (BBHE) for Flash Memory with a P-channel Cell", (1995) IEEE, pp. 279-282.

Toh et al., "A Double-Gate Tunneling Field-Effect Transistor with Silicon—Germanium Source for High-Performance, Low Standby Power, and Low Power Technology Applications", Extended Abstracts of the 2007 International Conference on Solid State Devices and Materials, Tsukuba, 2007, pp. 894-895.

\* cited by examiner

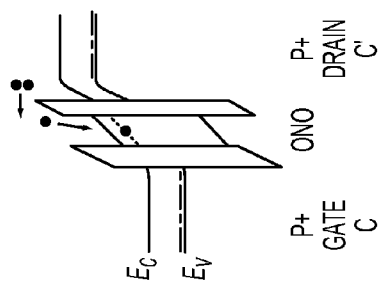
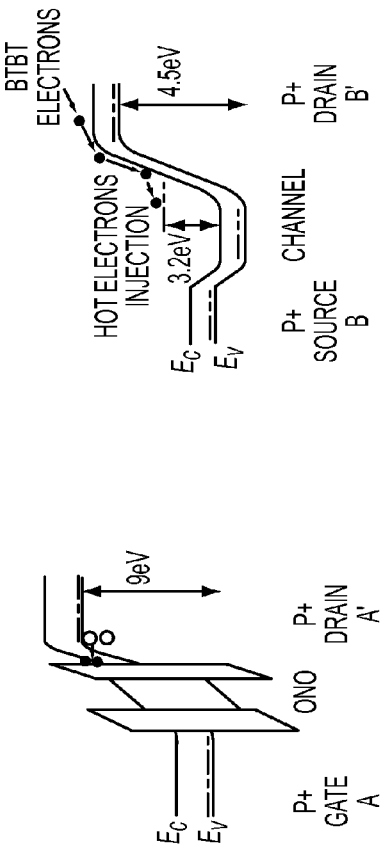
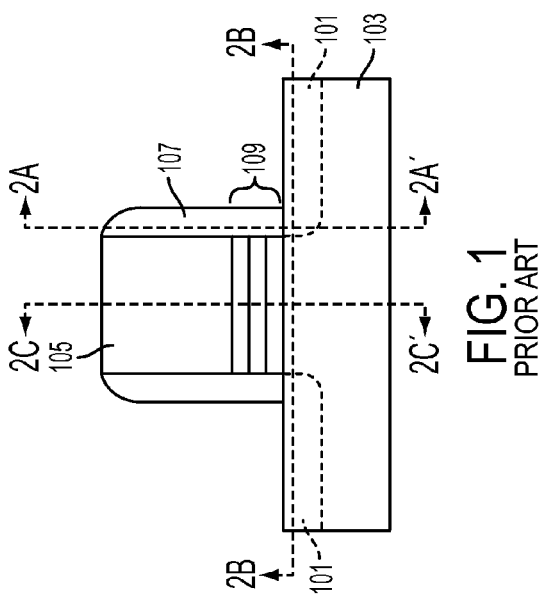

P-CHANNEL FLASH WITH ENHANCED BAND-TO-BAND TUNNELING HOT ELECTRON INJECTION

TECHNICAL FIELD

The present disclosure relates to flash memory devices with improved program speed and lower power consumption. The present disclosure is particularly applicable to p-channel flash memory devices for 32 nanometer (nm) technologies and beyond.

BACKGROUND

Flash memories, both embedded and standalone, have been growing in importance in modern day electronics, with most of the development focusing on re-channel flash memories. Focus has turned to p-channel flash memories, as illustrated in FIG. 1, for high speed and low power operation. Adverting to FIG. 1, the p-channel flash memory includes p+ source/drain regions 101 in a substrate 103, a gate 105 with spacers 107, and a charge storage stack 109 which may be formed of various storage materials including oxide-polysilicon-oxide and oxide-nitride-oxide. Programming of the cell is accomplished by channel hot-hole induced hot electron injection (CHE). Hot-holes cause electron-hole pair generation by impact ionization at the drain side. The generated holes are drifted to the drain whereby the electrons are accelerated in the channel and become hot enough to overcome the barrier of the tunneling oxide. The p-channel cell is preferred over the n-channel cell due to a greater vertical electric field across the tunneling oxide, which favors electron injection, which in turn increases the probability/number of elections being injected. The cell is then erased by Fowler-Nordheim (FN) tunneling.

To increase electron injection efficiency, programming utilizing band-to-band tunneling induced hot electron (BBHE) injection has been employed. Improved injection efficiency arises from the higher vertical electric field at the electron injection point. Table 1 illustrates an example of various operating conditions for programming using BBHE.

TABLE 1

|  | Vcg (V) | Vd (V) | Vs (V) | Vsub (V) |
| --- | --- | --- | --- | --- |
| Program (CHE) | 4.5 | 0 | 4.5 | 4.5 |
| Program (BBHE) | 6 | −3 | float | 1.5 |
| Erase (FN) | −5.5 | 6 | 6 | 6 |
| Read | 1.5 | 0 | 1.5 | 1.5 |

FIGS. 2A through 2C illustrate the energy band diagrams for the device of FIG. 1 extracted along A-A', B-B', and C-C', respectively, during programming using BBHE. As illustrated in FIG. 2A, band-to-band tunneling (BTBT) of electrons occurs from the drain to the surface. The electrons are then accelerated to the source, as illustrated in FIG. 2B. Some electrons, however, will gain enough energy to overcome the tunnel oxide barrier, as shown in FIG. 2C.

Efforts to improve BBHE have included increasing the gate-to-drain overlap region/area or using narrower bandgap materials at the drain side to increase the number of BTBT electrons. However, these approaches result in earlier punch-through and/or increasing junction leakage, which in turn limits scaling or results in larger memory cells. Additionally, forming narrow bandgap materials in the drain and extending it sufficiently below the gate for adequate gate-to-drain overlap is difficult.

A need therefore exists for p-channel memory cells exhibiting improved BBHE for programming while maintaining a compact cell size and good device characteristics, and for enabling methodology.

SUMMARY

An aspect of the present disclosure is a method of fabricating a p-channel memory cell with a raised source/drain and a hetero junction layer, formed by selective epitaxial growth, on each side of the charge storage stack.

Another aspect of the present disclosure is a p-channel memory cell with a raised source/drain and a hetero junction layer on each side of the charge storage stack.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a dummy gate stack on a substrate; forming a layer on the substrate by selective epitaxial growth, on each side of the dummy gate stack; forming spacers on the layer; forming raised source/drains; removing the dummy gate stack, forming a cavity between the spacers; and forming a memory gate stack in the cavity.

Aspects of the present disclosure include forming the raised source/drains by deep source/drain implantation in the layer. Other aspects include forming the raised source/drains by in situ doping during selective epitaxial growth of the layer. Further aspects including recess etching the layer, leaving only the portion under the spacers; forming a second layer, by selective epitaxial growth on the substrate, adjacent the first layer and to substantially the same thickness as the first layer; and subsequently forming the raised source/drains by deep source/drain implantation in the second layer. Another aspect including forming the second layer of a wide bandgap material. Additional aspects including recess etching the layer, leaving only the portion under the spacers; forming a second layer, by selective epitaxial growth on the substrate, adjacent the first layer and to substantially the same thickness as the first layer; and forming the raised source/drains by in situ doping during selective epitaxial growth of the second layer. Other aspects including recess etching the layer, leaving only the portion under the spacers; forming a second layer by selective epitaxial growth on the substrate, adjacent each side of the dummy gate stack, to a thickness less than the thickness of the first layer; forming a third layer by selective epitaxial growth on the second layer, the second and third layers having a total thickness substantially equal to the thickness of the first layer; and subsequently forming the raised source/drains by deep source/drain implantation in the third layer. Additional aspects including forming the first and third layers of a wide bandgap material. Further aspects including recess etching the layer, leaving only the portion under the spacers; forming a second layer by selective epitaxial growth on the substrate, adjacent each side of the dummy gate stack, to a thickness less than the thickness of the first layer; forming a third layer by selective epitaxial growth on the second layer, the second and third layers having a total thickness substantially equal to the thickness of the first layer; and forming the raised source/drains by in situ doping during selective epitaxial growth of the third layer.

Another aspect of the present disclosure is a device including: a substrate; a layer on the substrate, the layer having an opening with sidewalls; a memory gate stack in the opening, the memory gate stack comprising a charge storage stack around the sides and bottom of a gate stack, the thickness of the memory gate stack being greater than the thickness of the layer; spacers formed on the layer on both sides of the memory gate stack; and raised source/drains.

Aspects include a device having a layer of a narrow band gap material. Further aspects include a device wherein raised source/drains are formed in the layer. Other aspects include a device including a layer formed only under the spacers; and the device further including: a second layer adjacent the first layer and having substantially the same thickness as the first layer. Another aspect includes a device having a second layer of a wide band gap material. Additional aspects include a device having a layer only under the spacers; the device further including: a second layer on the substrate and adjacent the first layer, the second layer having a thickness less than the first layer; and a third layer on the second layer, the second and third layers having a total thickness substantially equal to the thickness of the first layer. Further aspects include a device having first and third layers of a wide bandgap material.

Another aspect of the present disclosure is a method including: forming a dummy gate stack on a substrate; forming a layer on the substrate by selective epitaxial growth, on each side of the dummy gate stack; removing the dummy gate stack, forming a cavity; forming a memory gate stack in the cavity to a height greater than the thickness of the layer; forming spacers on the layer on each side of the memory gate stack; and forming raised source/drains.

Aspects include forming the layer of a narrow band gap material. Another aspect includes forming the raised source/drains by deep source/drain implantation in the layer. Additional aspects include forming the raised source/drains by in situ doping during selective epitaxial growth of the layer. Further aspects include recess etching the layer, leaving only the portion under the spacers; forming a second layer, by selective epitaxial growth on the substrate, adjacent the first layer and to substantially the same thickness as the first layer; and subsequently forming the raised source/drains by deep source/drain implantation in the second layer. Other aspects include forming the second layer of a wide band gap material. Another aspect includes recess etching the layer, leaving only the portion under the spacers; forming a second layer, by selective epitaxial growth on the substrate, adjacent the first layer and to substantially the same thickness as the first layer; and forming the raised source/drains by in situ doping during selective epitaxial growth of the second layer. Additional aspects include recess etching the layer, leaving only the portion under the spacers; forming a second layer by selective epitaxial growth on the substrate and adjacent each side of the dummy gate structure, to a thickness less than the thickness of the first layer; forming a third layer by selective epitaxial growth on the second layer, the second and third layers having a total thickness substantially equal to the thickness of the first layer; and subsequently forming the raised source/drains by deep source/drain implantation in the third layer. Further aspects include forming the first and second layers of a wide band gap material. Another aspect includes recess etching the layer, leaving only the portion under the spacers; forming a second layer by selective epitaxial growth on the substrate and adjacent each side of the dummy gate structure, to a thickness less than the thickness of the first layer; forming a third layer by selective epitaxial growth on the second layer, the second and third layers having a total thickness substantially equal to the thickness of the first layer; and forming the raised source/drains by in situ doping during selective epitaxial growth of the third layer.

Another aspect of the present disclosure is a device comprising: a substrate; a layer on the substrate, the layer having an opening with sidewalls; a charge storage stack along the sidewalls and bottom surface of the opening; a gate electrode stack on the charge storage stack, the thickness of the charge storage stack and the gate electrode stack being greater than the thickness of the layer; spacers formed on the layer on both sides of the memory gate stack; and raised source/drains.

Aspects include a device having a layer of a narrow bandgap material. Another aspect includes a device wherein the raised source/drains are formed in the layer. Further aspects include a device having a layer is only under the spacers; the device further including: a second layer adjacent the first layer and having the same thickness as the first layer. Additional aspects include a device a second layer of a wide band gap material. Other aspects include a device including a layer only under the spacers; the device further including: a second layer on the substrate and adjacent the first layer, the second layer having a thickness less than the first layer; and a third layer on the second layer, the second and third layers having a total thickness substantially equal to the thickness of the first layer. Further aspects include a device having first and third layers of a wide bandgap material.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 1 schematically illustrates a prior art p-channel flash memory cell;

FIGS. 2A through 2C illustrate energy band diagrams for the device of FIG. 1 extracted along A-A', B-B', and C-C', respectively, during programming using BBHE;

DETAILED DESCRIPTION

Figure 3A:
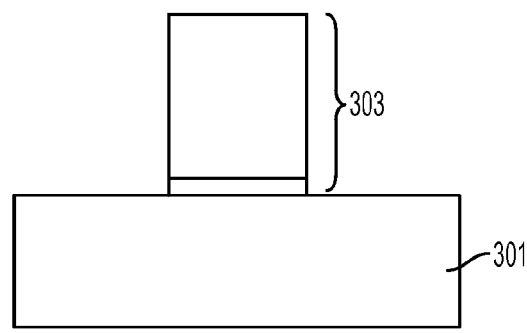
FIGS. 3A through 3G schematically illustrate a process flow for forming a p-channel memory cell, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of insufficient BBHE for higher electron injection rate and lower power consumption attendant upon aggressive device scaling for flash memories. In accordance with embodiments of the present disclosure, a hetero junction with energy band engineering is employed to enhance BBHE injection for improved program speed and lower power consumption. In addition, the tunneling region is increased for both programming and erasing without sacrificing cell compactness. Further, a raised source/drain results in a shallower junction for better short channel effect and lower series resistance.

Methodology in accordance with embodiments of the present disclosure includes forming a dummy gate stack on a substrate, forming a layer on the substrate by selective epitaxial growth, on each side of the dummy gate stack, forming spacers on the layer, forming raised source/drains, removing the dummy gate stack, forming a cavity between the spacers, and forming a memory gate stack in the cavity.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 3A through 3G schematically illustrate a process flow for forming a p-channel memory cell with a raised source/drain of a narrower bandgap material, in accordance with an exemplary embodiment. Adverting to FIG. 3A, after standard isolation and well implantation (not shown for illustrative convenience) are performed in substrate 301, a dummy gate stack 303 is formed on substrate 301. Dummy gate stack 303 may, for example, may be formed of nitride on oxide which are deposited on substrate 303 and patterned using lithography and dry etching to a width of 10 nm to 200 nm and to a height of 200 Å to 2000 Å. Alternatively, dummy gate stack 303 may be formed of polysilicon on oxide and may include thin nitride or oxide spacers (not shown).

Figure 3B:
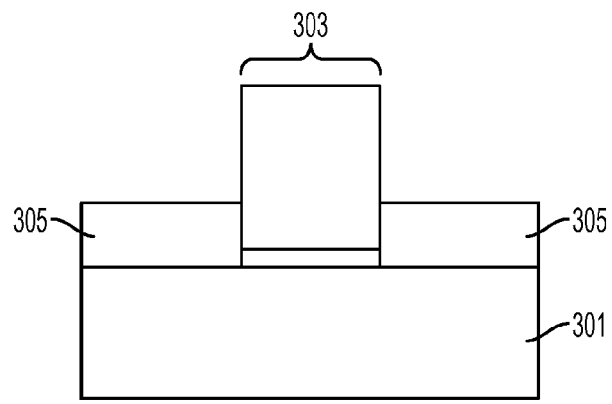
Figure 3C:
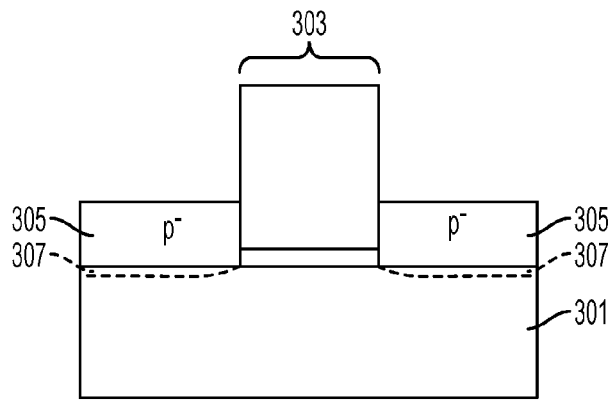

Layer 305 is then formed by selective epitaxial growth (SEG) on each side of dummy gate stack 303 to a thickness of 100 Å to 1000 Å, as illustrated in FIG. 3B. Layer 305 may be formed, for example, of silicon germanium (SiGe) or silicon carbon (Si:C), and the SEG may be performed at a temperature of 200° C. to 800° C. The SEG may be in situ doped or formation of source/drain extensions 307, illustrated in FIG. 3C, may include halo and extension implantation.

Figure 3D:
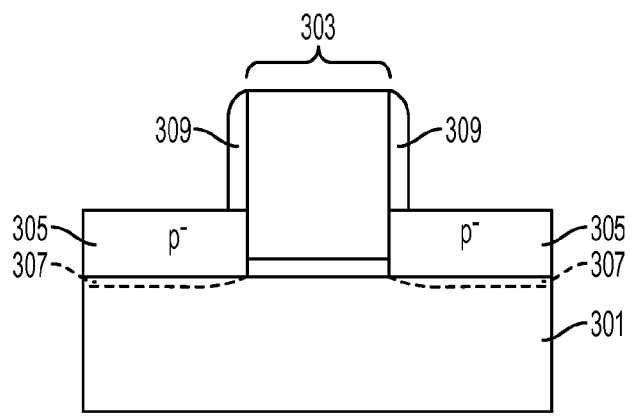

As illustrated in FIG. 3D, spacers 309 are formed on layer 305 on each side of gate stack 303. Spacers 309 may be formed of various materials, such as oxide or nitride or combination of oxide and nitride.

Figure 3E:
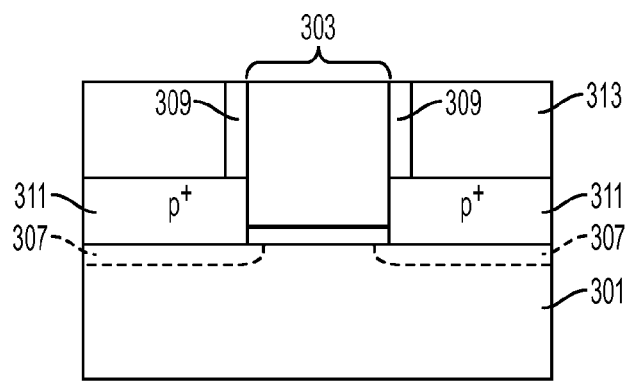
Figure 3F:
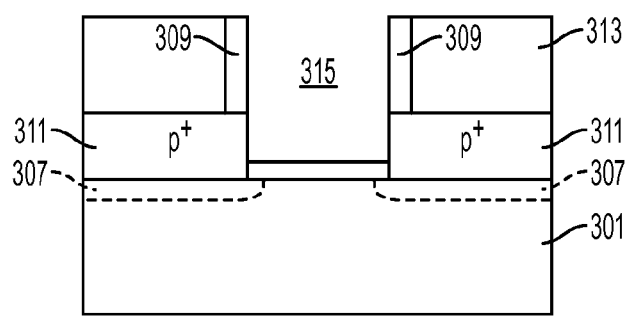

Adverting to FIG. 3E, source/drain 311 is formed by deep source/drain implantation and annealing. Alternatively, if SEG of layer 305 is carried out with in situ doping, then deep source/drain implantation becomes unnecessary and may be omitted. Silicidation (not shown for illustrative convenience) is carried out, interlayer dielectric (ILD) 313, for example oxide, is formed over the entire substrate, and chemical mechanical polishing (CMP) is performed to expose the top of dummy gate stack 303 and until spacers 309 are flush with dummy gate stack 303. Similar to a replacement gate process, dummy gate stack 303 is then removed, for example by selective wet or dry etching, as illustrated in FIG. 3F, forming recess 315.

Figure 3G:
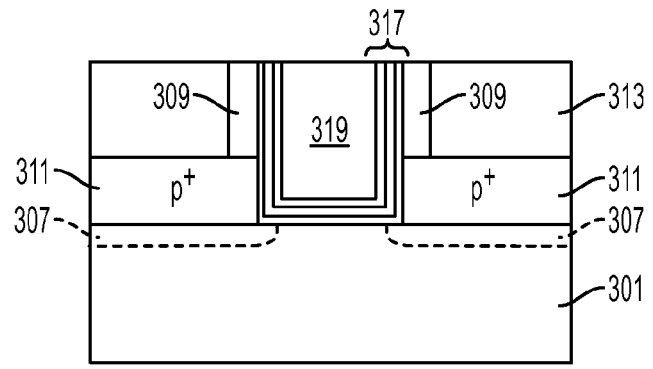

As illustrated in FIG. 3G, a memory storage stack 317 may then be formed in recess 315 of an oxide-polysilicon-oxide (a floating gate), an oxide-nitride-oxide (ONO), or any other storage stack. The individual layers of the memory storage stack may have thicknesses of 10 Å to 100 Å, 10 Å to 100 Å, and 50 Å to 500 Å, respectively. Gate electrode 319 is then formed in the remaining space of recess 315.

Figure 4A:
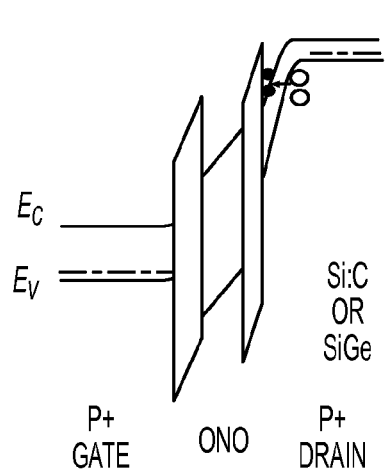
FIGS. 4A and 4B schematically illustrate energy band diagrams from the gate to drain direction and from the drain to channel, respectively, for the structure of FIG. 3G.
Figure 4B:
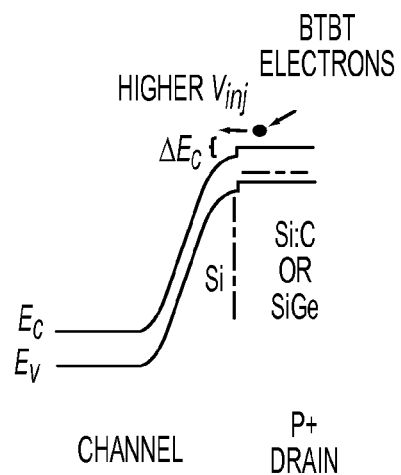

In the p-channel memory cell of FIG. 3G, the gate stack sits on a charge storage stack and is embedded into a raised source/drain structure, which increases the gate-to-drain overlap area for higher BTBT rate during both programming and erasing without sacrificing cell compactness. The narrow bandgap material of the raised source/drain (i.e., the SiGe or Si:C) helps enhance the BTBT of electrons during programming and erasing by narrowing the tunneling width. FIG. 4A shows the energy band diagram from the gate to drain direction, illustrating how the narrower bandgap enhances BTBT. Depending on the materials used, the possible band offset at the drain increases the injection velocity and energy of the BTBT electrons, leading to more electrons with enough energy to be injected across the tunnel oxide. FIG. 4B shows the energy band diagram from the drain to channel illustrating how the band offset at the drain results in higher injection velocity that would increase the energy of the electrons.

Figure 5A:
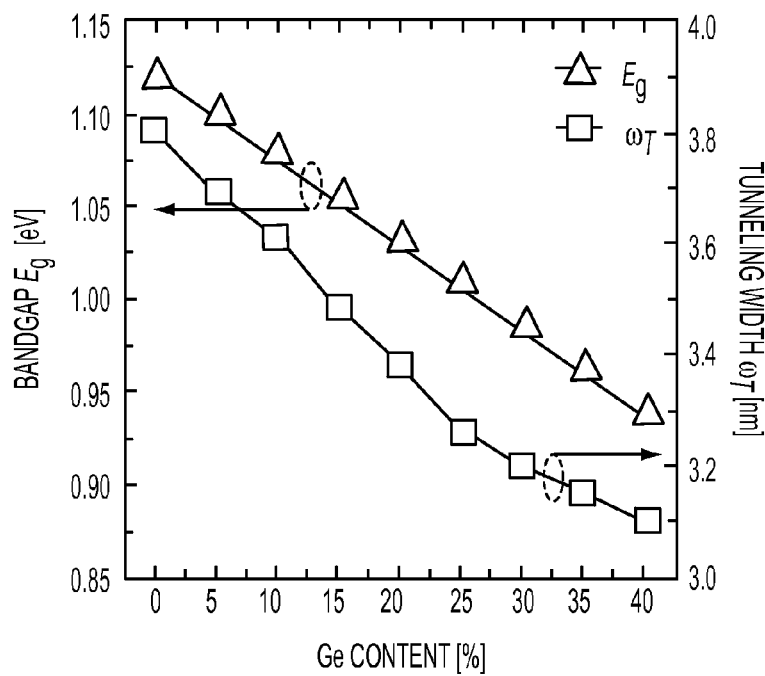
FIG. 5A plots bandgap and tunneling width versus germanium (Ge) content, and FIG. 5B plots BTBT rate versus electric field for different materials.
Figure 5B:
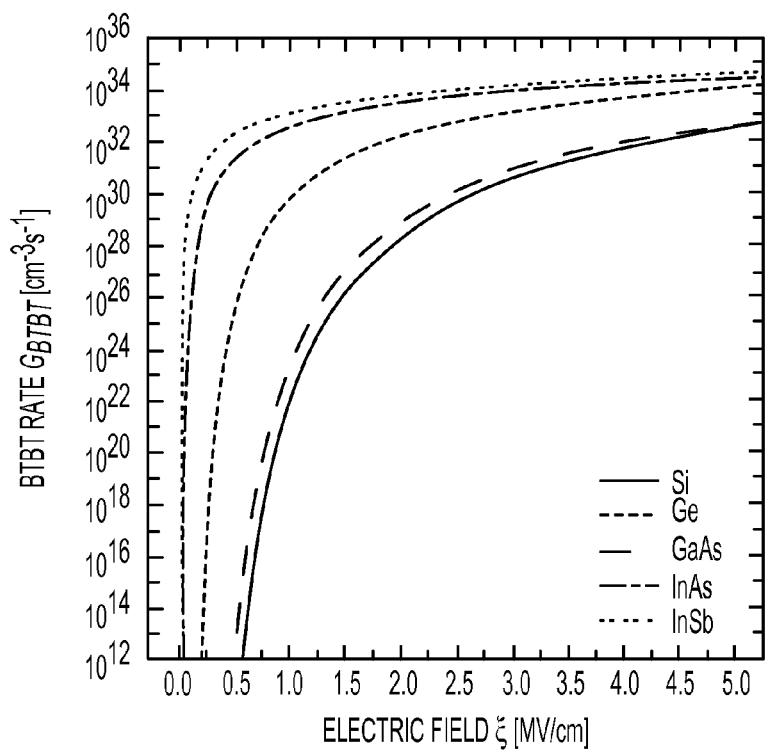

FIGS. 5A and 5B illustrate how different materials in the raised source/drain affect bandgap, tunneling width, and BTBT rate. FIG. 5A plots bandgap and tunneling width versus germanium (Ge) content. FIG. 5B shows BTBT rate versus electric field for different materials—silicon (Si), Ge, gallium arsenide (GaAs), indium arsenide (InAs), and indium antimonide (InSb). BTBT rate $G_{BTBT}$ is defined as $$G_{BTBT} = A \frac{\xi^2}{E_g^{\frac{1}{2}}} \cdot \exp\left(-B \frac{E_g^{\frac{3}{2}}}{\xi}\right) \quad \text{Equation 1}$$

in which $$A = \frac{e^2 \cdot \sqrt{m}}{2 \cdot \pi \cdot \hbar^2} \quad \text{Equation 2}$$

and $$B = \frac{\pi \cdot \sqrt{m}}{2 \cdot e \cdot \hbar}. \quad \text{Equation 3}$$

The beneficial compressive stress from layer 1 also increases the mobility/energy of the BTBT electrons, and the performance of the select transistor. In addition, the memory cell may also operate as a two-bit cell by injecting electrons from the source or drain side, and doing a forward or reverse reading.

Figure 6A:
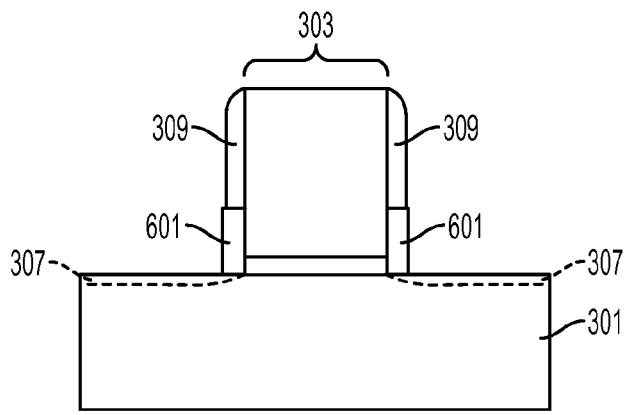
FIGS. 6A through 6E schematically illustrate a process flow for forming a p-channel memory cell, in accordance with another exemplary embodiment.

FIGS. 6A through 6E schematically illustrate a process flow for forming a p-channel memory cell with a raised source/drain of two materials, in accordance with another exemplary embodiment. The initial process flow of this embodiment is the same as that illustrated in FIGS. 3A through 3D. After the spacer formation of FIG. 3D, layer 305 is recess etched, using for example dry etch (reactive-ion-etch (RIE)), leaving only portion 601 under spacers 309 as illustrated in FIG. 6A.

Figure 6B:
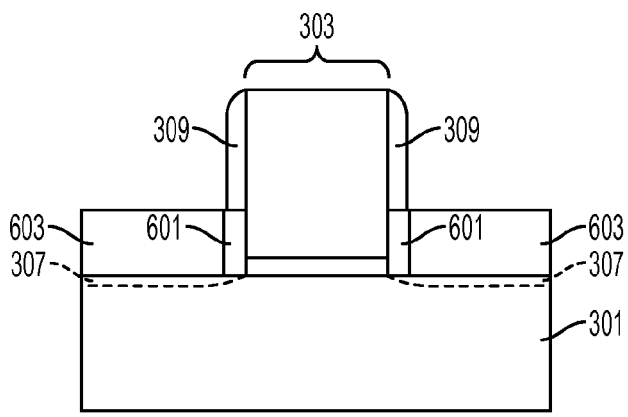

Adverting to FIG. 6B, second layer 603 is grown by SEG to a thickness of 100 Å to 1000 Å to reform the source/drain region. Second layer 603 may be formed of a wide bandgap material, such as Si, at a temperature of 200° C. to 800° C.

Figure 6C:
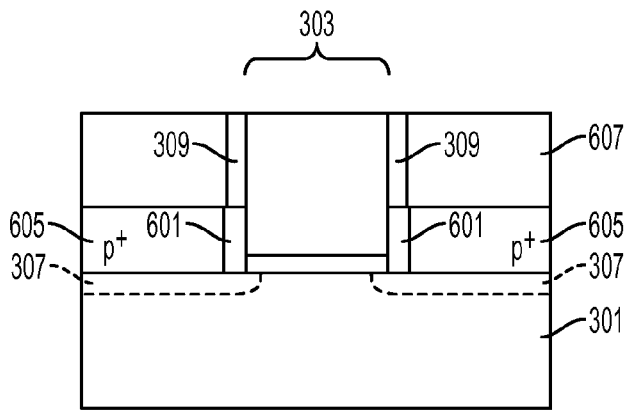
Figure 6D:
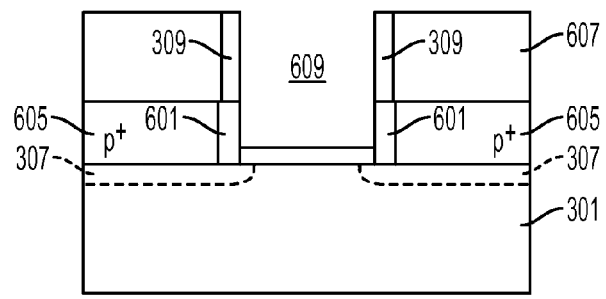

The process continues similar to FIGS. 3E through 3G. As illustrated in FIG. 6C, source/drain 605 is formed by deep source/drain implantation and annealing. Alternatively, if SEG of layer 603 is carried out with in situ doping, then deep source/drain implantation becomes unnecessary and may be omitted. Silicidation (not shown for illustrative convenience) is carried out, interlayer dielectric (ILD) 607, for example oxide, is formed over the entire substrate, and CMP is performed to expose the top of dummy gate stack 303 and until spacers 309 are flush with dummy gate stack 303. Dummy gate stack 303 is then removed, for example by selective wet or dry etching, as illustrated in FIG. 6D, forming recess 609.

Figure 6E:
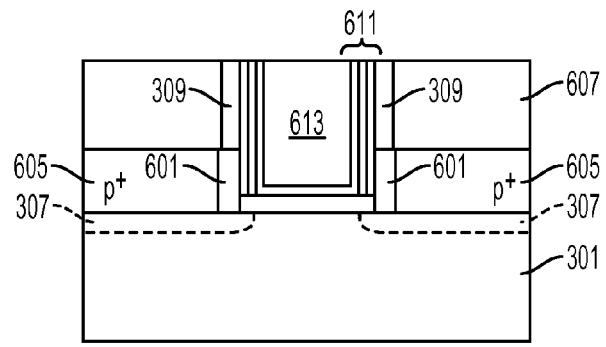

As illustrated in FIG. 6E, a memory storage stack 611 may then be formed in recess 609 of an oxide-polysilicon-oxide (a floating gate), an ONO, or any other storage stack. The individual layers of the memory storage stack may have thicknesses of 10 Å to 100 Å, 10 Å to 100 Å, and 50 Å to 500 Å, respectively. Gate electrode 613 is then formed in the remaining space of recess 609.

The main difference between the p-channel memory cell of FIG. 6E and that of FIG. 3G is that only a small region adjacent to the gate stack (portion 601) is formed of a narrow bandgap material for efficient BTBT to occur. The bulk of the raised source/drain structure (605), is formed of a wide bandgap material to reduce the junction leakage and improve the short channel effect, thereby improving cell characteristics for reading. Similar to the first embodiment, the band offset at the drain side may increase the number of BTBT electrons that can be injected across the tunnel oxide, thereby allowing the memory cell to operate at a higher speed or at the same speed with a lower operating voltage. Accordingly, high speed programming with low power consumption may be achieved.

Figures 7A, 7B:
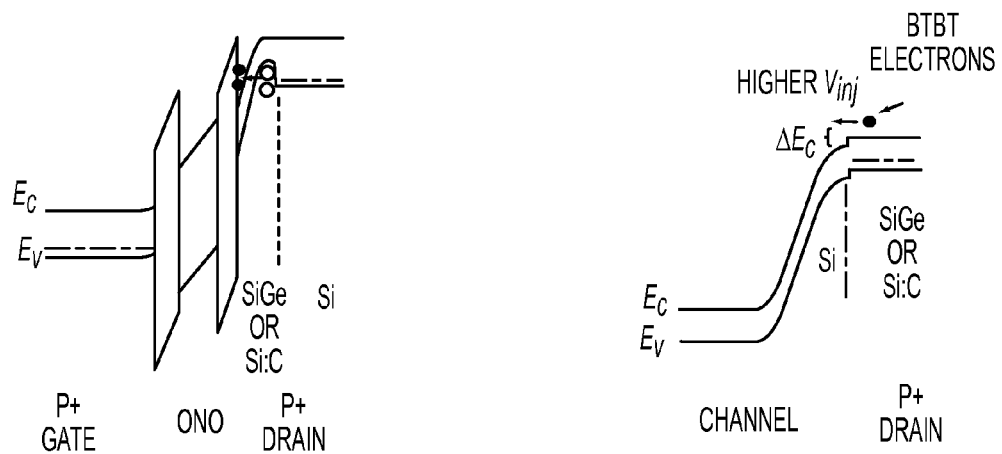
FIG. 7A shows the energy band diagram from the gate to drain direction and FIG. 7B shows the energy band diagram from the drain to channel for the structure of FIG. 6E.

FIG. 7A shows the energy band diagram from the gate to drain direction for the structure of FIG. 6E, illustrating how a narrower bandgap enhances BTBT.

FIG. 7B shows the energy band diagram from the drain to channel for the structure of FIG. 6E, illustrating how the band offset at the drain results in higher injection velocity, which increases the energy of the electrons.

Figure 8A:
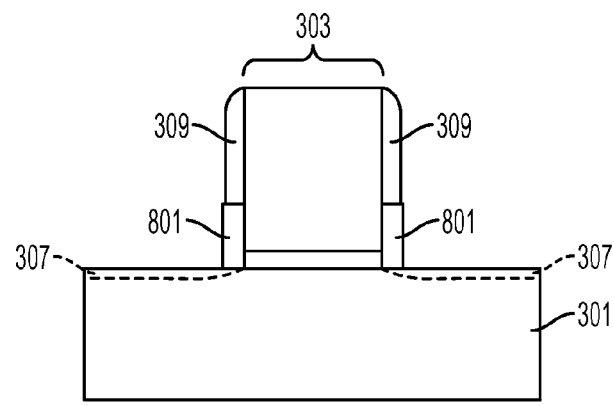
FIGS. 8A through 8F schematically illustrate a process flow for forming a p-channel memory cell, in accordance with another exemplary embodiment.

FIGS. 8A through 8E schematically illustrate a process flow for forming a p-channel memory cell with a raised source/drain of three materials, in accordance with another exemplary embodiment. The initial process flow of this embodiment is similar to that illustrated in FIGS. 3A through 3D, with the exception that layer 305 is formed, for example, of silicon. After the spacer formation of FIG. 3D, layer 305 is recess etched, using for example dry etch (RIE), leaving only portion 801 under spacers 309 as illustrated in FIG. 8A.

Figure 8B:
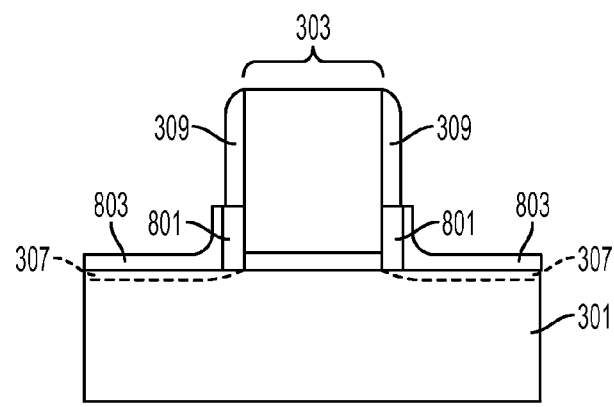

Adverting to FIG. 8B, a thin second layer 803 is grown by SEG adjacent first layer 801 and over substrate 301. Second layer 803 is formed, for example, of Ge and to a thickness of 10 Å to 200 Å.

Figure 8C:
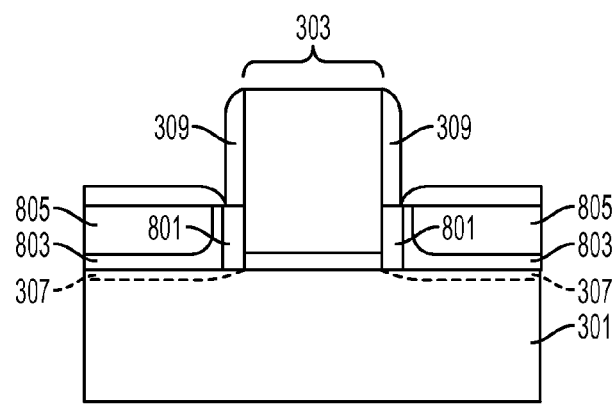

As illustrated in FIG. 8C, a third layer 805 is grown by SEG on layer 803. Third layer 805 is formed of a wide bandgap material, for example, Si, and may be formed to a thickness of 50 Å to 500 Å.

Figure 8D:
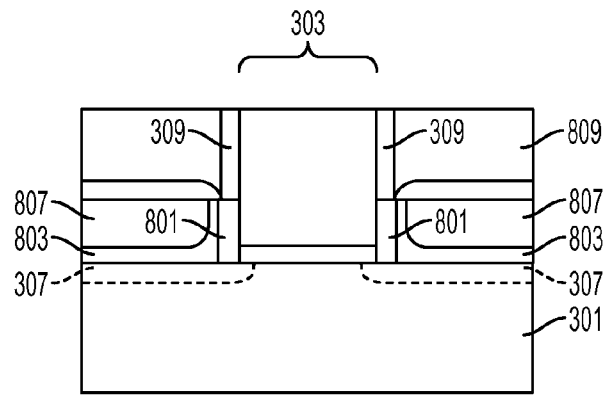
Figure 8E:
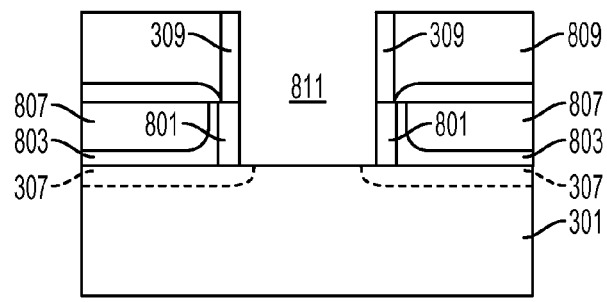

The process continues similar to FIGS. 3E through 3G. As illustrated in FIG. 8D, source/drain 807 is formed by deep source/drain implantation and annealing. Alternatively, if SEG of layer 805 is carried out with in situ doping, then deep source/drain implantation becomes unnecessary and may be omitted. Silicidation (not shown for illustrative convenience) is carried out, interlayer dielectric (ILD) 809, for example oxide, is formed over the entire substrate, and CMP is performed to expose the top of dummy gate stack 303 and) until spacers 309 are flush with dummy gate stack 303. Dummy gate stack 303 is then removed, for example by selective wet or dry etching, as illustrated in FIG. 8E, forming recess 811.

Figure 8F:
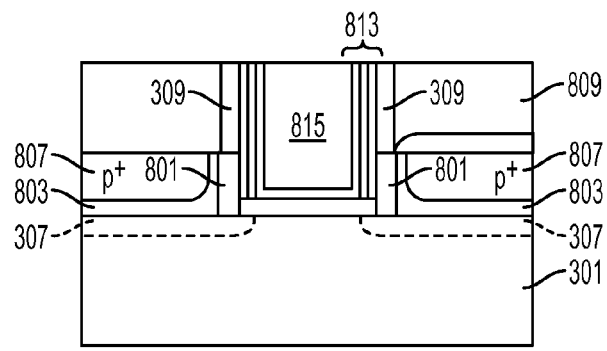

As illustrated in FIG. 8F, a memory storage stack 813 may then be formed in recess 811 of an oxide-polysilicon-oxide (a floating gate), an ONO, or any other storage stack. The individual layers of the memory storage stack may have thicknesses of 10 Å to 100 Å, 10 Å to 100 Å, and 50 Å to 500 Å, respectively. Gate electrode 815 is then formed in the remaining space of recess 811.

Figure 9:
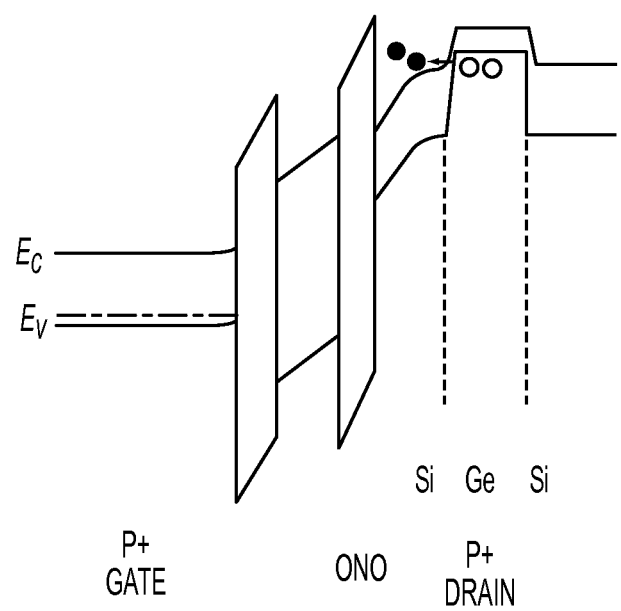
FIG. 9 shows an energy band diagram form the gate to drain direction for the structure of FIG. 8F.

In the structure of FIG. 8F, first layer 801 and second layer 803 form a hetero junction with a type-II staggered energy band alignment, to further enhance the BTBT of electrons. At very low bias, electrons are unable to tunnel from the second layer to the first layer, but at sufficient bias, electrons may tunnel easily, as illustrated in FIG. 9. Due to the staggered energy band alignment, the tunneling width that the electrons see will be much smaller than that of the bandgap of the first and second layers, which dramatically improves the BTBT rate and, thus, programming speed. It also allows low voltage operation with lower power consumption. In addition, like second layer 603 of the structure of FIG. 6E, third layer 805 is a wide bandgap material to reduce junction leakage and improve memory cell characteristics for reading.

FIGS. 10A through 10G schematically illustrate a process flow for forming a p-channel memory cell with a raised source/drain of a narrower bandgap material, in accordance with another exemplary embodiment. Adverting to FIG. 10A, standard isolation and well implantation (not shown for illustrative convenience) are carried out on substrate 1001. A dummy gate stack 1003 is then formed on substrate 1001. Dummy gate stack 1003 may be formed by depositing nitride on oxide and patterning using lithography and dry etching.

Figure 10A:
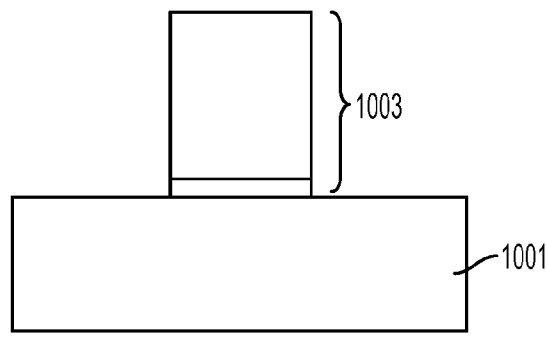
FIGS. 10A through 10G schematically illustrate a process flow for forming a p-channel memory cell, in accordance with another exemplary embodiment.
Figure 10B:
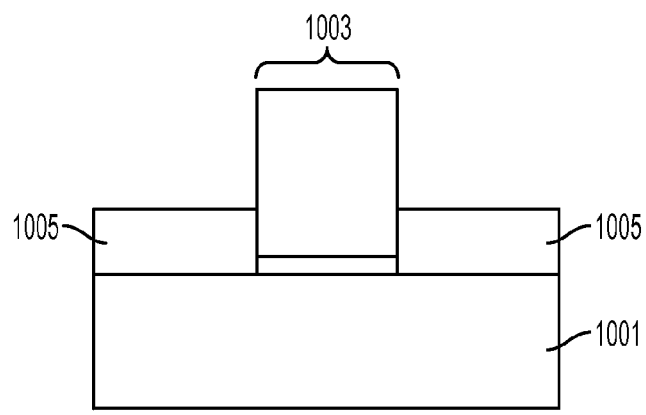
Figure 10C:
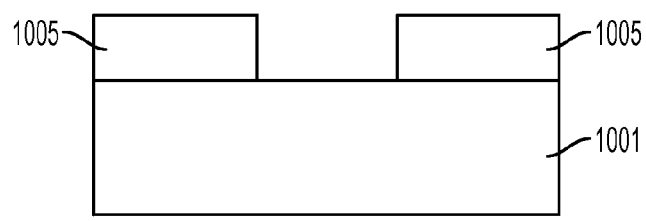

As illustrated in FIG. 10B, layer 1005 is formed by SEG of SiGe or Si:C, for example, layer 1005 may be grown to a thickness of 100 Å to 1000 Å under conditions of 200° C. to 800° C. Dummy gate stack 1003 may then removed by selective wet etching or dry etching, as illustrated in FIG. 10C.

Figure 10D:
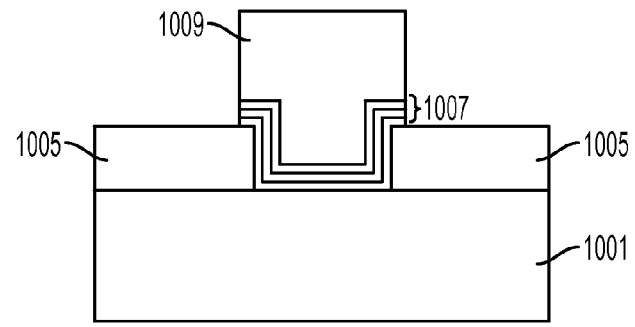

Adverting to FIG. 10D, the memory storage stack 1007 is then formed, for example of oxide-polysilicon-oxide (a floating gate), ONO, or another storage stack. The individual layers may have thicknesses of 10 Å to 100 Å, 10 Å to 100 Å, and 50 Å to 500 Å, respectively. Gate electrode 1009 is then formed on memory storage stack 1007.

Figure 10E:
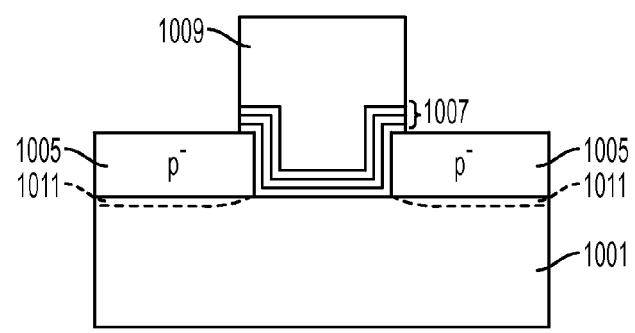
Figure 10F:
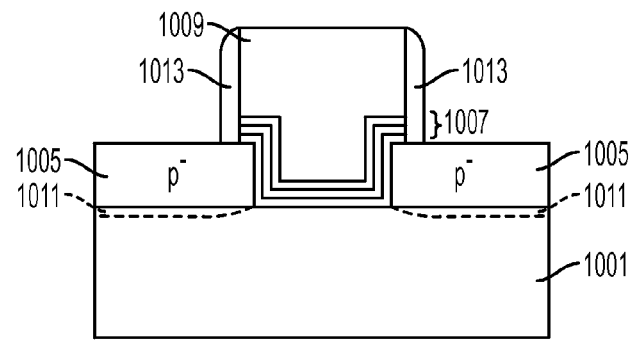

As illustrated in FIG. 10E, halo and extension implantation is carried out for formation of source/drain extension 1011. Spacers 1013 are formed on both sides of gate 1009, as illustrated in FIG. 10F. Spacers 1013 may be formed of various materials, such as oxide or nitride or combination of oxide and nitride.

Figure 10G:
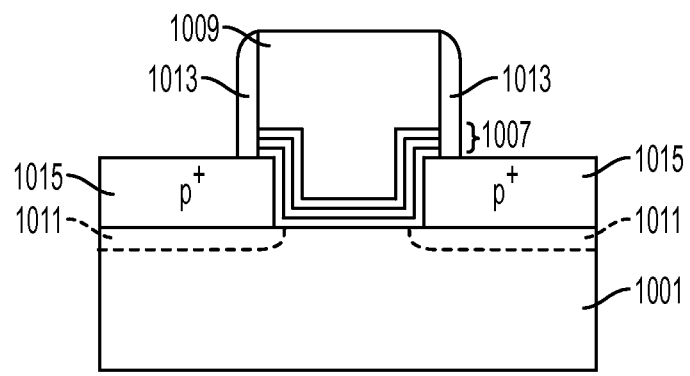

Adverting to FIG. 10G, source/drain 1015 is formed by deep source/drain implantation and annealing. Silicidation, deposition of an interlayer dielectric (ILD), and CMP until spacers 1013 are flush with gate 1009 (not shown for illustrative convenience) may then be performed, followed by further BEOL processing.

Figure 11A:
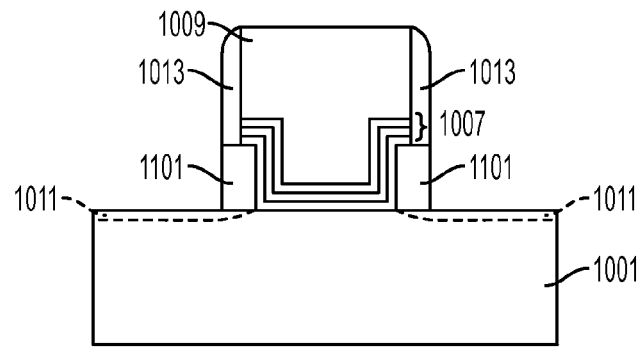
FIGS. 11A through 11C schematically illustrate a process flow for forming a p-channel memory cell, in accordance with another exemplary embodiment.
Figure 11B:
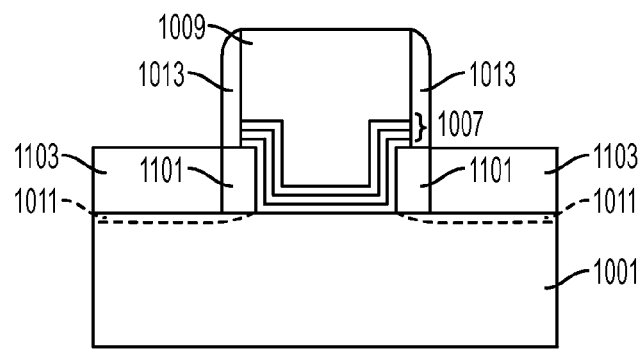
Figure 11C:
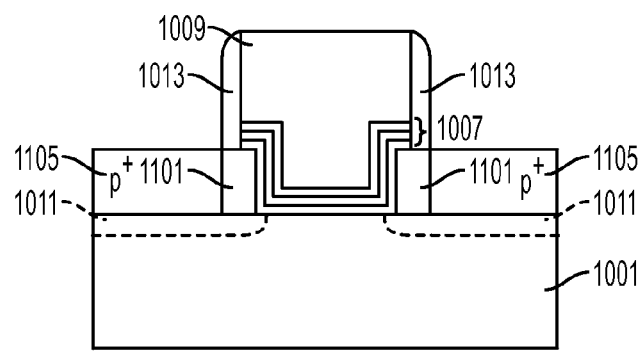

FIGS. 11A through 11C schematically illustrate a process flow for forming a p-channel memory cell with a raised source/drain of two materials, in accordance with another exemplary embodiment. The initial process flow of this embodiment is the same as that illustrated in FIGS. 10A through 10F. After the spacer formation of FIG. 10F, layer 1005 is recess etched, using for example dry etch (RIE), leaving only portion 1101 under spacers 1013 as illustrated in FIG. 11A.

Adverting to FIG. 11B, second layer 1103 is grown by SEG to a thickness of 100 Å to 1000 Å to reform the source/drain region. Second layer 1103 may be formed of a wide bandgap material, such as Si, at a temperature of 200° C. to 800° C.

The process continues, as illustrated in FIG. 11C, with source/drain 1105 being formed by deep source/drain implantation and annealing. Alternatively, if SEG of layer 1103 is carried out with in situ doping, then deep source/drain implantation becomes unnecessary and may be omitted. Silicidation, deposition of an ILD, and CMP until spacers 1013 are flush with gate 1009 (not shown for illustrative convenience) may then performed, followed by further BEOL processing.

Figure 12A:
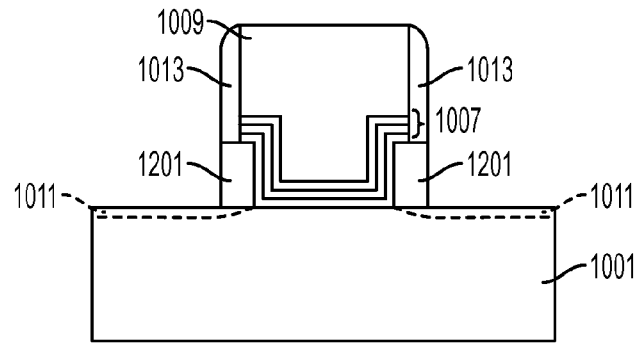
FIGS. 12A through 12D schematically illustrate a process flow for forming a p-channel memory cell, in accordance with another exemplary embodiment.

FIGS. 12A through 12D schematically illustrate a process flow for forming a p-channel memory cell with a raised source/drain of three materials, in accordance with another exemplary embodiment. The initial process flow of this embodiment is similar to that illustrated in FIGS. 10A through 10F, with the exception that layer 1005 is formed, for example, of silicon. After the spacer formation of FIG. 10F, layer 1005 is recess etched, using for example dry etch (RIE), leaving only portion 1201 under spacers 1013 as illustrated in FIG. 12A.

Figure 12B:
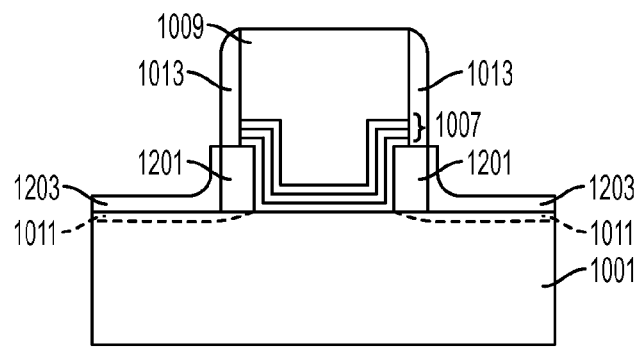

Adverting to FIG. 12B, a thin second layer 1203 is grown by SEG adjacent first layer 1201 and over substrate 1001. Second layer 1203 is formed, for example, of Ge and to a thickness of 10 Å to 200 Å.

Figure 12C:
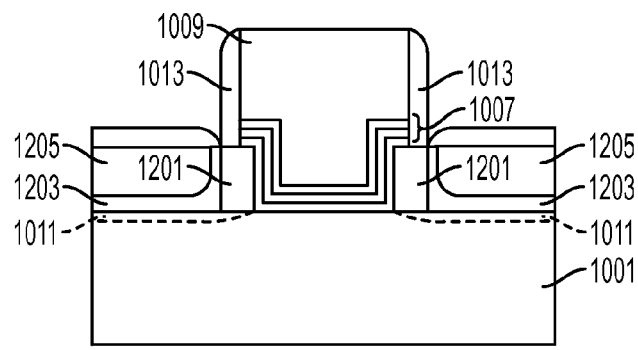

As illustrated in FIG. 12C, a third layer 1205 is grown by SEG on layer 1203. Third layer 1205 is formed of a wide bandgap material, for example, Si, and may be formed to a thickness of 50 Å to 500 Å.

Figure 12D:
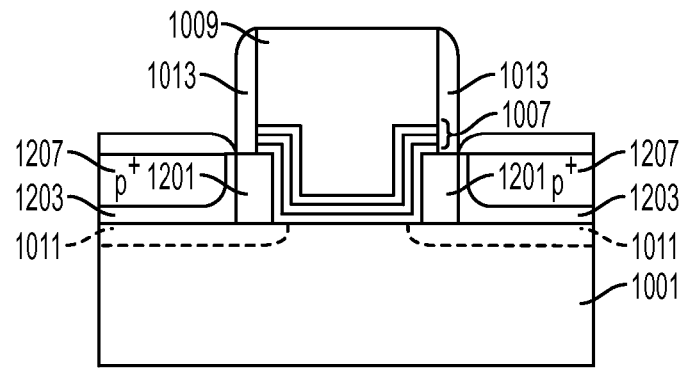

The process continues, as illustrated in FIG. 12D, with deep source/drain implantation and annealing, forming source/drain 1207. Alternatively, if SEG of layer 1205 is carried out with in situ doping, then deep source/drain implantation becomes unnecessary and may be omitted. Silicidation, formation of an ILD, and CMP until spacers 1013 are flush with gate 1009 (not shown for illustrative convenience) may then performed, followed by further BEOL processing.

Figure 13:
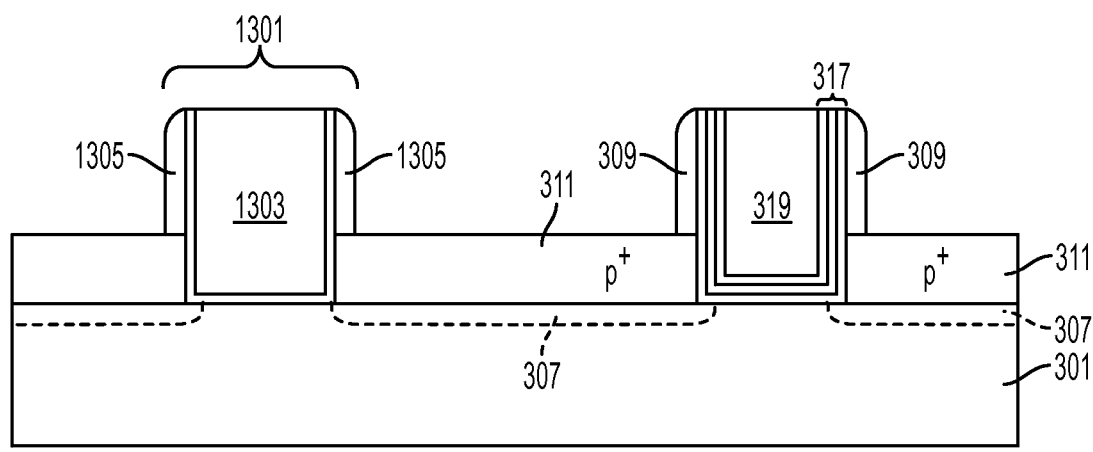
FIG. 13 schematically illustrates a 2T memory cell including the p-channel memory cell of FIG. 3G in combination with a select transistor, in accordance with an exemplary embodiment.

The p-channel memory cells of the various embodiments may be employed independently or may be connected to select transistors (i.e., a 1T/1.5T/2T memory cell). For example, FIG. 13 illustrates a 2T memory cell including the p-channel memory cell of FIG. 3G in combination with a select transistor 1301 including gate 1303 and spacers 1305. The integration of the memory cell and the select transistor or logic devices could be carried out using various known methods, including, but not limited to the following.

For example, select transistor 1301 may be formed of a high-k metal gate with a gate first approach and masked while the p-channel memory cell is formed by a gate last approach. The charge storage stack, therefore, would not exist in the select transistor/logic region after the CMP. To form a gate first select transistor and gate last memory cell, the same gate stack used for the select/logic transistor may also be used for the dummy gate stack in the formation of the p-channel memory cell. Alternatively, the select/logic transistor may employ a high-k metal gate/a-Si gate stack and the memory cell may employ an oxide/aSi dummy gate stack. For example, a high-k metal gate may be deposited for both the select/logic transistor and the memory cell. The high-k metal gate materials may then be etched away from memory cell region. An oxide layer may then be formed for the memory cell, and a-Si may be deposited for both the dummy gate stack of the memory cell and also the gate stack for the select/logic transistor. Finally, the gate stack may be defined for both transistors (for example, by etching the a-Si followed by a metal gate etch with the memory cell region being protected). Another integration scheme for the gate first select/logic transistor with the gate last memory cell includes a separate definition of two gate stacks. A gate dielectric and electrode material may be deposited, patterned, and etched to define the gate stack for the select/logic transistor, followed by deposition of dummy gate stack materials and definition of the dummy gate stack for the memory cell.

Alternatively, both the select/logic transistor and the memory cell may be formed by a gate last process. For example, while performing steps 3A through 3E for the memory cell, a dummy gate stack may also be formed for the select/logic transistor. After CMP in FIG. 3E, a hard mask may be formed on the select/logic transistor region. The dummy gate stack may then be removed from the memory cell, followed by charge storage stack and metal gate deposition, CMP, and formation of a hard mask over the memory cell region. The dummy gate stack of the select/logic transistor may then be removed, followed by a conventional replacement metal gate process.

Yet another alternative may include a single gate last process for both the select/logic transistor and the memory cell. After dummy gate removal, the charge storage stack may be deposited on both the select/logic transistor and memory cell region. Using a mask, an isotropic dry etch with high selectivity may be employed to remove the charge storage stack from the select/logic transistor region, similar to replacement gate processes in which different work function tuning layers are used for the n and p FETs. After deposition of appropriate high-k layers for the select/logic transistor, metal gate material may be deposited and CMP performed.

Alternatively, a polysilicon gate stack may be employed for the select/logic transistor while the memory cell uses a replacement gate process. In other words, the select/logic transistor region may be masked while the replacement gate process is performed on the memory cell region.

The embodiments of the present disclosure can achieve several technical effects, including improved program speed and lower power consumption, increased tunneling region for both programming and erasing without sacrificing cell compactness, improved short channel effect and lower series resistance, and good junction leakage with narrower bandgap material. The present disclosure enjoys industrial applicability in any of various types of highly integrated semiconductor devices that require non-volatile memories.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a dummy gate stack on a substrate;
    forming a first layer of a narrow bandgap material on the substrate by selective epitaxial growth, on each side of the dummy gate stack;
    forming spacers on the first layer;
    forming raised source/drains;
    removing the dummy gate stack, subsequent to forming the raised source/drains, forming a cavity between the spacers; and
    forming a memory gate stack in the cavity recess etching the first layer, leaving only the portion under the spacers; forming a second layer, by selective epitaxial growth on the substrate, adjacent the first layer and to substantially the same thickness as the first layer; and subsequently forming the raised source/drains by deep source/drain implantation in the second layer, wherein forming the second layer of a wide bandgap material.

2. The method according to claim 1, comprising forming the raised source/drains by deep source/drain implantation in the first layer.

3. The method according to claim 1, comprising forming the raised source/drains by in situ doping the first layer during selective epitaxial growth.

4. The method according to claim 1, comprising:
    recess etching the first layer, leaving only the portion under the spacers;
    forming a second layer, by selective epitaxial growth on the substrate, adjacent the first layer and to substantially the same thickness as the first layer; and
    forming the raised source/drains by in situ doping the layer during selective epitaxial growth of the second layer.

5. The method according to claim 1, comprising:
    recess etching the first layer, leaving only the portion under the spacers;
    forming a second layer by selective epitaxial growth on the substrate, adjacent each side of the dummy gate stack, to a thickness less than the thickness of the first layer;
    forming a third layer by selective epitaxial growth on the second layer, the second and third layers having a total thickness substantially equal to the thickness of the first layer; and
    subsequently forming the raised source/drains by deep source/drain implantation in the third layer.

6. The method according to claim 1, comprising:
    recess etching the first layer, leaving only the portion under the spacers;
    forming a second layer by selective epitaxial growth on the substrate, adjacent each side of the dummy gate stack, to a thickness less than the thickness of the first layer;
    forming a third layer by selective epitaxial growth on the second layer, the second and third layers having a total thickness substantially equal to the thickness of the first layer; and
    forming the raised source/drains by in situ doping the layer during selective epitaxial growth of the third layer.

7. A method comprising:
    forming a dummy gate stack on a substrate;
    forming a first layer of a narrow band gap material on the substrate by selective epitaxial growth, on each side of the dummy gate stack;
    removing the dummy gate stack, forming a cavity;
    forming a memory gate stack in the cavity to a height greater than the thickness of the first layer;
    forming spacers, subsequent to forming the memory gate stack, on the first layer on each side of the memory gate stack; and
    forming raised source/drains recess etching the first layer, leaving only the portion under the spacers; forming a second layer, by selective epitaxial growth on the substrate, adjacent the first layer and to substantially the same thickness as the first layer; and subsequently forming the raised source/drains by deep source/drain implantation in the second layer wherein forming the second layer of a wide band gap material.

8. The method according to claim 7, comprising forming the raised source/drains by deep source/drain implantation in the first layer.

9. The method according to claim 7, comprising forming the raised source/drains by in situ doping during selective epitaxial growth of the first layer.

10. The method according to claim 7, comprising:
    recess etching the first layer, leaving only the portion under the spacers;
    forming a second layer, by selective epitaxial growth on the substrate, adjacent the first layer and to substantially the same thickness as the first layer; and
    forming the raised source/drains by in situ doping during selective epitaxial growth of the second layer.

11. The method according to claim 7, comprising:
    recess etching the first layer, leaving only the portion under the spacers;
    forming a second layer by selective epitaxial growth on the substrate and adjacent each side of the dummy gate structure, to a thickness less than the thickness of the first layer;
    forming a third layer by selective epitaxial growth on the second layer, the second and third layers having a total thickness substantially equal to the thickness of the first layer; and
    subsequently forming the raised source/drains by deep source/drain implantation in the third layer.

12. The method according to claim 11, comprising forming the second layer of a wide band gap material.

13. The method according to claim 7, comprising:
    recess etching the first layer, leaving only the portion under the spacers;
    forming a second layer by selective epitaxial growth on the substrate and adjacent each side of the dummy gate structure, to a thickness less than the thickness of the first layer;

forming a third layer by selective epitaxial growth on the second layer, the second and third layers having a total thickness substantially equal to the thickness of the first layer; and forming the raised source/drains by in situ doping during selective epitaxial growth of the third layer.

* * * * *